(12) United States Patent
Aouini et al.

(10) Patent No.: US 11,804,847 B2
(45) Date of Patent: Oct. 31, 2023

(54) FRACTIONAL FREQUENCY SYNTHESIS BY SIGMA-DELTA MODULATING FREQUENCY OF A REFERENCE CLOCK

(71) Applicant: Ciena Corporation, Hanover, MD (US)

(72) Inventors: Sadok Aouini, Gatineau (CA);
Matthew Mikkelsen, Ottawa (CA);
Naim Ben-Hamida, Ottawa (CA);
Mahdi Parvizi, Kanata (CA); Tingjun Wen, Ottawa (CA); Calvin Plett, Ottawa (CA)

(73) Assignee: Ciena Corporation, Hanover, MD (US)

( * ) Notice: Subject to any disclaimer, the term of this patent is extended or adjusted under 35 U.S.C. 154(b) by 2 days.

(21) Appl. No.: 16/205,308

(22) Filed: Nov. 30, 2018

(65) Prior Publication Data

US 2020/0177194 A1 Jun. 4, 2020

(51) Int. Cl.
*H03L 7/197* (2006.01)

(52) U.S. Cl.
CPC .................. *H03L 7/1976* (2013.01)

(58) Field of Classification Search
CPC ..... H03L 7/099; H03L 7/1974; H03L 7/1976; H03K 7/06
USPC .......................................... 327/113, 115, 117
See application file for complete search history.

(56) References Cited

U.S. PATENT DOCUMENTS

| | | | |
|---|---|---|---|
| 6,867,734 B2 * | 3/2005 | Voor | H03J 7/065 342/357.64 |
| 7,742,507 B1 | 6/2010 | Kurowski et al. | |
| 8,493,111 B1 | 7/2013 | Bradley | |
| 9,787,466 B2 | 10/2017 | Aouini et al. | |
| 10,063,367 B1 | 8/2018 | Aouini et al. | |
| 10,367,516 B2 * | 7/2019 | Thompson | H03M 1/1245 |
| 2003/0067405 A1 * | 4/2003 | Keaveney | G06F 17/17 341/143 |
| 2007/0152757 A1 | 7/2007 | Sridharan | |
| 2009/0121749 A1 | 5/2009 | Roberts et al. | |
| 2010/0123488 A1 * | 5/2010 | Palmer | H03L 7/1976 327/115 |
| 2012/0288044 A1 | 11/2012 | Roberts et al. | |

FOREIGN PATENT DOCUMENTS

| | | |
|---|---|---|
| EP | 1397772 A1 | 3/2004 |
| WO | 2010/056813 A1 | 5/2010 |

OTHER PUBLICATIONS

Jan. 3, 2020, International Search Report and Written Opinion for International Application No. PCT/US2019/056029.

* cited by examiner

*Primary Examiner* — Ryan Johnson
*Assistant Examiner* — Colleen J O Toole
(74) *Attorney, Agent, or Firm* — Baratta Law PLLC; Lawrence A. Baratta, Jr.

(57) ABSTRACT

A circuit includes a programmable frequency divider which receives a high-speed clock, $f_{in}$, as an input and which provides a modulated reference clock as an output; a Sigma-Delta modulator which receives a Frequency Control Word (FCW) and which is connected to the programmable frequency divider to receive the modulated reference clock as a sample clock and to control an average frequency of the modulated reference clock; and an integer-N Phase Lock Loop (PLL) which receives the modulated reference clock and outputs a clock output.

16 Claims, 5 Drawing Sheets

FRACTIONAL FREQUENCY SYNTHESIS BY SIGMA-DELTA MODULATING FREQUENCY OF A REFERENCE CLOCK

FIELD OF THE DISCLOSURE

The present disclosure generally relates to electrical circuits. More particularly, the present disclosure relates to systems and methods for fractional frequency synthesis by sigma-delta modulating frequency of a reference clock such as to realize a Numerically Controlled Oscillator (NCO) function.

BACKGROUND OF THE DISCLOSURE

A Numerically Controlled Oscillator (NCO) is a digital signal generator which creates a synchronous, discrete-time, discrete-valued representation of a waveform. NCOs are used in many communications systems including digital up/down converters used in wireless and software radio systems, digital Phase Lock Loops (PLL), radar systems, drivers for optical or acoustic transmissions, and multilevel modulators/demodulators. The popular approach to fractional-N frequency synthesis using sigma-delta modulation utilizes a fully dedicated fractional-N Type-II PLL-based synthesizer (Phase-Frequency Detector (PFD), charge pump, loop filter, Voltage Controlled Oscillator (VCO), programmable frequency divider, and Sigma-Delta modulator in a feedback path, which uses a constant frequency clock as an input.

If an integer-N synthesizer is already available, it would require a redesign to convert it to a fractional-N synthesizer. Also, for realizing the NCO function serving as the reference clock of another PLL (e.g., a PLL in a Serialized/Deserializer (SerDes) system), a fully dedicated fractional PLL is required. These approaches require additional footprint, power, and cost. The dedicated PLL is an analog solution which is best verified in silicon, whereas a digital solution could be verified more easily. The frequency resolution of the sigma-delta modulated divider is also limited by the frequency of the VCO.

BRIEF SUMMARY OF THE DISCLOSURE

In an embodiment, a circuit includes a programmable frequency divider which receives a high-speed clock, $f_{in}$, as an input and which provides a modulated reference clock as an output; a Sigma-Delta modulator which receives a Frequency Control Word (FCW) and which is connected to the programmable frequency divider to receive the modulated reference clock as a sample clock and to control an average frequency of the modulated reference clock; and an integer-N Phase Lock Loop (PLL) which receives the modulated reference clock and outputs a clock output. The modulated reference clock average frequency is equal to $$\frac{f_{in}}{1+FCW},$$

and wherein the clock output frequency is equal to $$f_{in}\frac{M}{1+FCW}.$$

The high-speed clock can be from a second PLL associated with the circuit. The second Phase Lock Loop (PLL) can be for a Digital-Analog Converter (DAC) sampling clock. The circuit can further include an integer divisor (I) that is connected to the programmable frequency divisor, and provides a Numerically Controlled Oscillator (NCO) function based on selected values for the FCW, the integer divisor, and the integer-N PLL, and wherein the circuit drives a Serializer/Deserializer (SerDes). The FCW can define a numerator value for the programmable frequency divider, and a denominator value for the programmable frequency divider can be set by one of i) rail voltages for an analog Sigma-Delta modulator and ii) a number of accumulator bits for a digital Sigma-Delta modulator. The circuit can be disposed in an Application Specific Integrated Circuit (ASIC) on a Printed Circuit Board (PCB). The high-speed clock can be from a second PLL on the ASIC which receives an input reference clock from the PCB.

In another embodiment, an apparatus includes a Printed Circuit Board (PCB) with a reference clock; a circuit including: a Phase Lock Loop (PLL) which is served by the reference clock; a programmable frequency divider which receives a high-speed clock, $f_{in}$, as an input and provides a modulated reference clock as an output, wherein the high-speed clock is reused from the reference clock; a Sigma-Delta modulator which receives a Frequency Control Word (FCW), and which is connected to the programmable frequency divider to receive the modulated reference clock as a sample clock and to control an average frequency of the modulated reference clock; and an integer-N Phase Lock Loop (PLL) which receives the modulated reference clock and outputs a clock output. The modulated reference clock average frequency is equal to $$\frac{f_{in}}{1+FCW},$$

and wherein the clock output frequency is equal to $$f_{in}\frac{M}{1+FCW}.$$

The high-speed clock can be from a second PLL associated with the circuit. The circuit can further include an integer divisor (I) that is connected to the programmable frequency divisor, and provides a Numerically Controlled Oscillator (NCO) function based on selected values for the FCW, the integer divisor, and the integer-N PLL, and wherein the circuit drives a Serializer/Deserializer (SerDes). The FCW can define a numerator value for the programmable frequency divider and a denominator value for the programmable frequency divider can be set by one of i) rail voltages for an analog Sigma-Delta modulator and ii) a number of accumulator bits for a digital Sigma-Delta modulator.

In a further embodiment, a method of operating a circuit includes receiving a high-speed clock, $f_{in}$, as an input to a programmable frequency divider; modulating the high-speed clock with a Sigma-Delta modulator which is connected to the programmable frequency divider to control an average frequency of an output of programmable frequency divider; controlling the Sigma-Delta modulator with a Frequency Control Word (FCW) and an integer divisor, each of the FCW and the integer divisor is connected to the programmable frequency divider; providing an output of the programmable frequency divider as a modulated reference clock, wherein the modulated reference clock is connected to the Sigma-Delta modulator as a sample clock; and receiving the modulated reference clock at an integer-N Phase Lock Loop (PLL) and outputting a clock output. The modulated reference clock average frequency is equal to $$\frac{f_{in}}{1+FCW},$$

and wherein the clock output frequency is equal to $$f_{in}\frac{M}{1+FCW}.$$

The high-speed clock can be from a second Phase Lock Loop (PLL) associated with the circuit. The circuit can provide a Numerically Controlled Oscillator (NCO) function based on selected values for the FCW, the integer divisor, and the integer-N PLLC, and wherein the circuit drives a Serializer/Deserializer (SerDes). The FCW can define a numerator value for the programmable frequency divider and a denominator value for the programmable frequency divider can be set by one of i) rail voltages for an analog Sigma-Delta modulator and ii) a number of accumulator bits for a digital Sigma-Delta modulator. The circuit can be disposed in an Application Specific Integrated Circuit (ASIC) on a Printed Circuit Board (PCB). The high-speed clock can be from a second PLL on the ASIC which receives an input reference clock from the PCB.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to systems and methods for fractional frequency synthesis by sigma-delta modulating frequency of a reference clock such as to realize a Numerically Controlled Oscillator (NCO) function. The systems and methods achieve fractional-N frequency synthesis using phase-locked loops (PLL). In an embodiment, the systems and methods provide an electrical circuit which can be placed as the reference clock input to an existing integer-N PLL-based frequency synthesizer for achieving fractional-N frequency synthesis without the need of a dedicated fractional-N PLL. The high-speed clock applied to the programmable frequency divider can be coming from an already existing PLL. For example, in a high-speed device such as an optical transceiver, the high-speed clock signal can be taken from the PLL generating the Digital-Analog Converter (DAC) sampling clock. In the configuration, the NCO function that drives a SerDes PLL and tracks the client side is realized by sigma-delta modulating the frequency of a divided down clock generated by the transmitter's main high-speed PLL. Typically, the NCO block includes a fully dedicated fractional PLL. In the proposed solution, this extra PLL is completely bypassed, and the SerDes PLL is used to act as the phase/frequency domain interpolation filter to extract the desired encoded clock frequency. Advantageously, the proposed solution can be used in a high-speed optical transceiver/modem circuit to reduce design effort, power consumption, chip footprint, and cost by replacing NCO circuitry which generates clocks for the SerDes.

Figure 1:
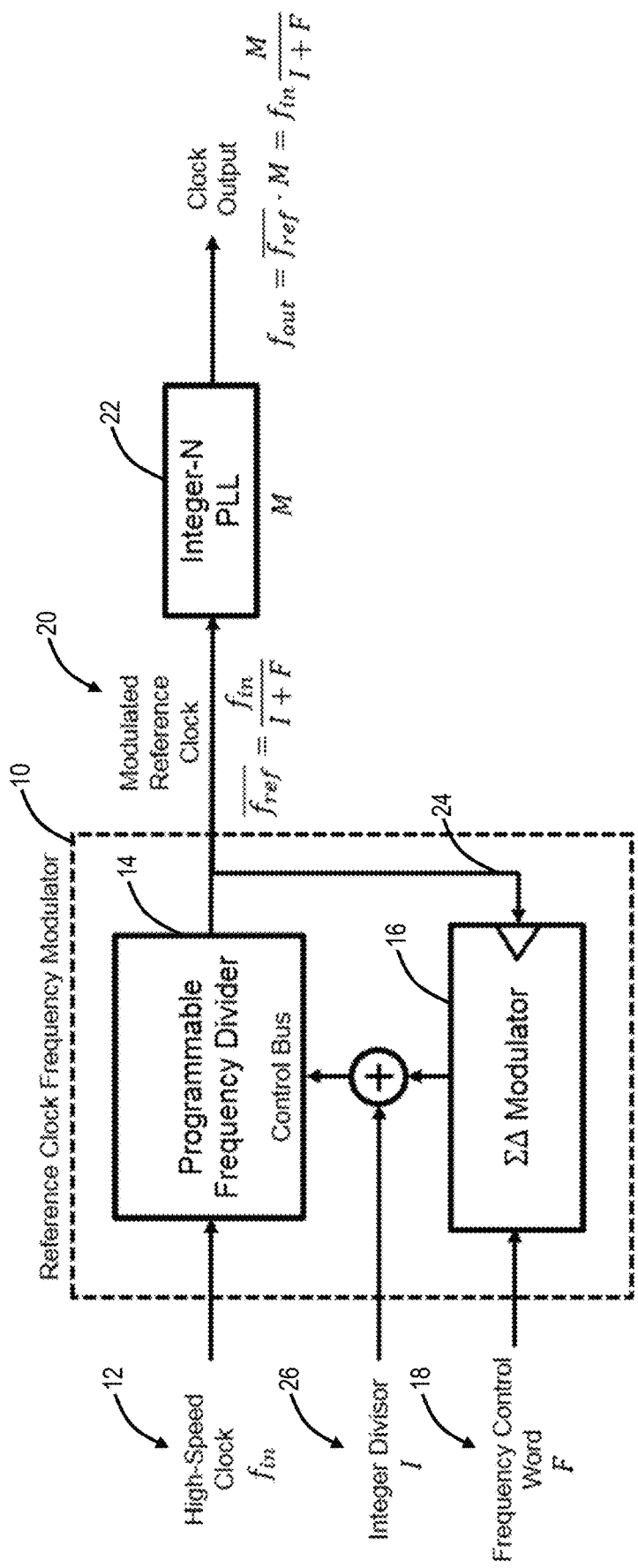
FIG. 1 is a block diagram of a reference clock frequency modulator device that divides a high-speed clock by a programmable frequency divider controlled through a Sigma-Delta (ΣΔ) modulator.

FIG. 1 is a block diagram of a reference clock frequency modulator device 10 that divides a high-speed clock 12 by a programmable frequency divider 14 controlled through a Sigma-Delta (ΣΔ) modulator 16. The reference clock frequency modulator device 10 is an electrical circuit and can be integrated with other circuits such as on a chip, Application Specific Integrated Circuit (ASIC), etc. The other circuits can include a SerDes and other circuits. The high-speed clock 12, $f_{in}$, can be an already available high-frequency clock on the chip, ASIC, SerDes, etc. For example, the high-speed clock 12 can be from an already existing PLL used to clock data converters. Variously, the reference clock frequency modulator device 10 can be used to provide a Numerically Controlled Oscillator (NCO) function.

The high-speed clock 12 is connected to the programmable frequency divider 14 which is configured to divide the high-speed clock 12, and the programmable frequency divider 14 is controlled by the Sigma-Delta modulator 16. The Sigma-Delta modulator 16 is input with a Frequency Control Word (FCW) 18, F, which is used to control the average frequency of the output of the programmable frequency divider 14. A frequency output 20 serves as a modulated reference clock to a PLL based integer-N frequency synthesizer/PLL 22 as well as the sample clock 24 for the Sigma-Delta modulator 16. The integer-N frequency synthesizer/PLL 22 typically includes a Phase Frequency Detector (PFD), charge pump, loop filter, Voltage-Controlled Oscillator (VCO), and a frequency divider, however other variants of PLL-based integer-N frequency synthesizers can be used so long as the loop filter is present. The frequency output 20 is input as the reference clock to an available integer-N PLL based synthesizer to achieve fractional-N frequency synthesis.

Through the modulation of the reference clock 20, the integer-N PLL 22 can achieve fractional-N frequency synthesis. It is known that the loop dynamics of the integer-N PLL 22 effectively set the output frequency of a VCO to be the product of the reference clock 20 frequency and a divisor ratio M set by the frequency divider (integer-N PLL 22). Since the closed-loop transfer function of such a PLL has a low-pass characteristic in both the frequency and phase domain, the average frequency of the modulated reference clock $\overline{f_{ref}}$ multiplied by M is observed at the output of the integer-N PLL 22. The average frequency of the reference clock 20 is given by dividing the input high-speed clock 12 frequency by the summation of an integer divisor I 26 of the programmable frequency divider 14 and the fractional value F which the FCW 18 represents. The FCW 18 typically defines the numerator of the fractional value; a Direct Current (DC) voltage with the denominator set by the rail voltages if the Sigma-Delta modulator 16 is an analog circuit or a binary integer with the denominator set by the number of accumulator bits if the Sigma-Delta modulator 16 is digital. Given an input clock frequency $f_{in}$, the output frequency $f_{out}$ can be determined:

$$f_{out} = f_{in} \frac{M}{I + FCW}$$

For example, assume a digital Multi-stage noise shaping (MASH) 111 sigma-delta modulator with 14-bit accumulators is used, M is 40, and the desired output frequency is 13.9762 GHz. Suppose a 14.3136 GHz clock is available as an input clock, then 1 can be set to 40 and F can be set to about 0.9655 using a digital FCW with a binary integer value of 15819:

$$13.9762 \text{ GHz} \approx 14.3136 \text{ GHz} \frac{40}{40 + 15819/2^{14}}$$

Figure 2:
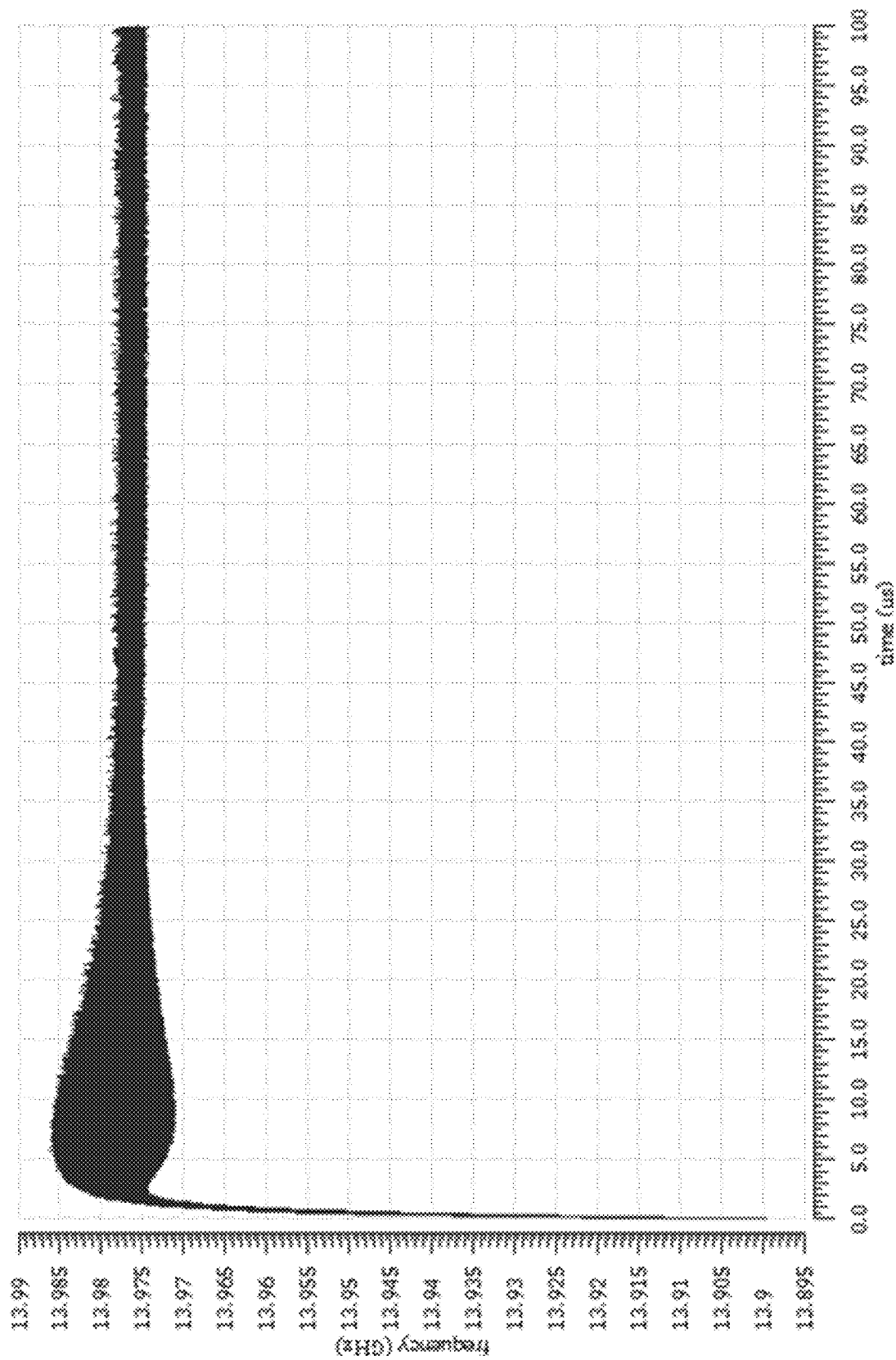
FIG. 2 is a graph of frequency versus time illustrating the simulated output frequency of the PLL settling to 13.9762 GHz; the desired multiple of the fractionally divided input clock frequency 14.3136 GHz, utilizing the reference clock frequency modulator device of FIG. 1.

FIG. 2 is a graph of frequency versus time illustrating the simulated output frequency of the PLL settling to 13.9762 GHz; the desired multiple of the fractionally divided input clock frequency 14.3136 GHz, utilizing the reference clock frequency modulator device 10.

Figure 3:
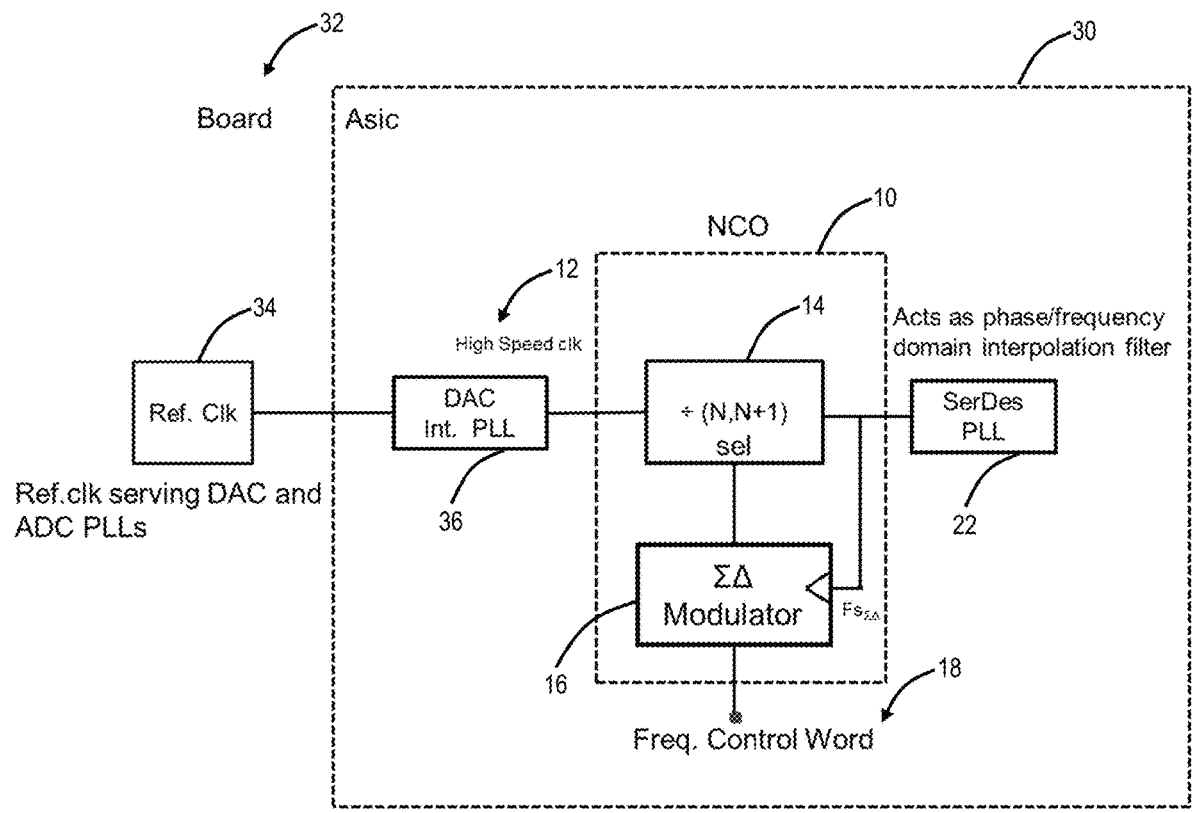
FIG. 3 is a block diagram of an Application Specific Integrated Circuit (ASIC) on a Printed Circuit Board (PCB) with the ASIC including the reference clock frequency modulator device of FIG. 1 and a high-speed clock available as an input to the ASIC.

FIG. 3 is a block diagram of an Application Specific Integrated Circuit (ASIC) 30 on a Printed Circuit Board (PCB) 32 with the ASIC 30 including the reference clock frequency modulator device 10 and the high-speed clock 12 available as an input to the ASIC 30. The high-speed clock 12 can be input from a reference clock 34 on the PCB 32 which is used to service DACs and/or Analog-Digital Converters (ADCs). The reference clock 34 can be connected to a DAC integer PLL 36 to provide the high-speed clock 12 to the reference clock frequency modulator device 10.

Again, the reference clock frequency modulator device 10 can receive the high-speed clock 12 which is from the reference clock 34, achieving fractional-N frequency synthesis without the need of a dedicated fractional-N PLL. The high-speed clock 12 applied to the programmable frequency divider 14 can be coming from an already existing PLL on the PCB 32. For example, the ASIC 30 and PCB 32 can be for a high-speed optical transceiver, and the high-speed clock 12 signal can be taken from the PLL generating the DAC sampling clock. In the configuration depicted in FIG. 3, the NCO function of the reference clock frequency modulator device 10 drives a SerDes PLL and tracks the client side is realized by sigma-delta modulating the frequency of a divided down clock generated by the transmitter's main high-speed PLL. Typically, the NCO block includes a fully dedicated fractional PLL. In the present disclosure, this extra PLL is completely bypassed and relying on the SerDes PLL to act as the phase/frequency domain interpolation filter to extract the desired encoded clock frequency.

Figure 4:
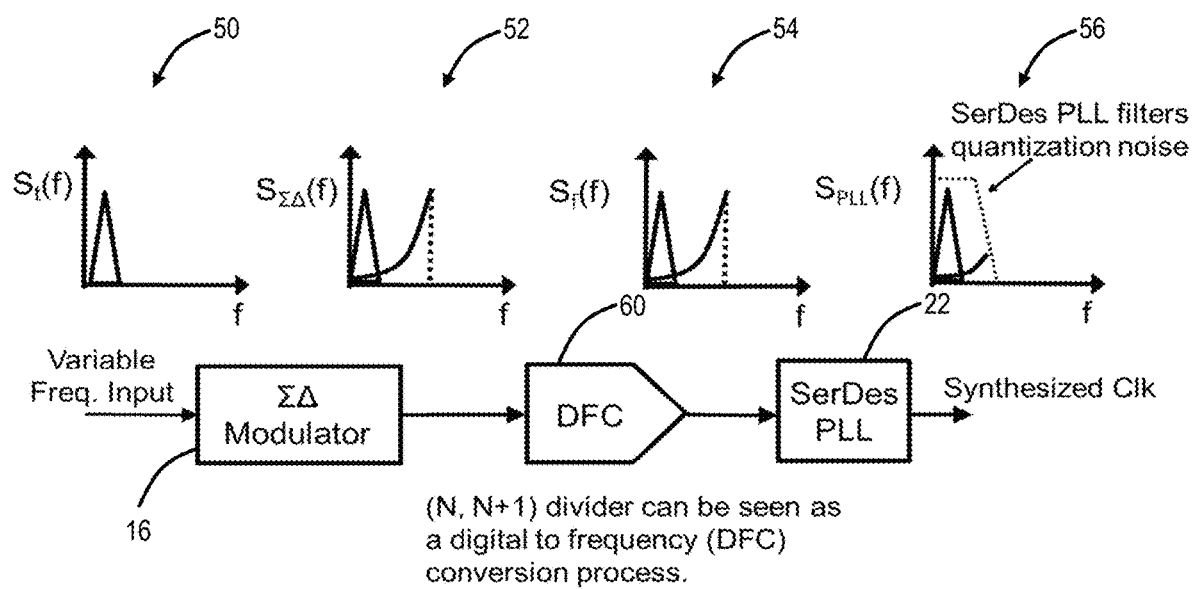
FIG. 4 is a diagram of the phase/frequency domain power spectral density at the various stages of the proposed NCO scheme via the reference clock frequency modulator device of FIG. 1.

FIG. 4 is a diagram of the phase/frequency domain power spectral density 50, 52, 54, 56 at the various stages of the proposed NCO scheme via the reference clock frequency modulator device 10. With the present disclosure, the approach is to send a reference clock (denoted by the phase/frequency domain power spectral density 50) with the desired frequency being sigma-delta encoded (denoted by the phase/frequency domain power spectral density 52) to a Digital-to-Frequency Conversion (DFC) process 60 (denoted by the phase/frequency domain power spectral density 54) to the SerDes PLL (denoted by the phase/frequency domain power spectral density 56) which acts as a frequency domain filter to extract the desired "clean" reference as depicted in FIG. 4. In fact, the modulated output can be input as the reference clock to the integer-N synthesizer (e.g., the integer-N PLL 22), without any redesign required, to convert it to a fractional-N synthesizer. Since the present disclosure can be fully implemented using solely digital circuits, it benefits from an uncomplicated design that can be easily verified. The frequency of the high-speed clock 12 and the range of divisors used during operation by the programmable frequency divider can be selected to optimize jitter performance, whereas a dedicated PLL would be limited by the frequency of the VCO.

Figure 5:
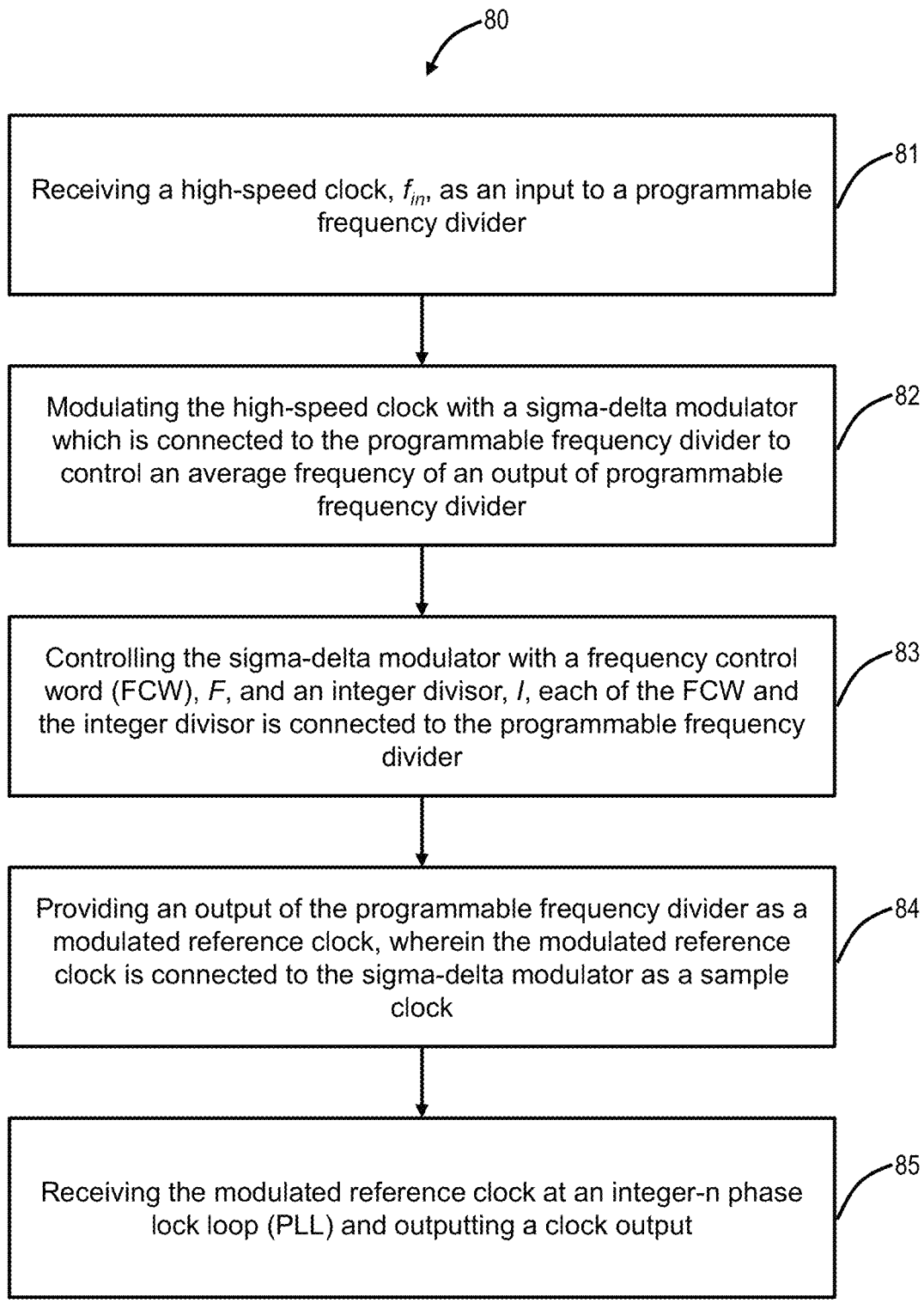
FIG. 5 is a flowchart of a process for operating a circuit.

FIG. 5 is a flowchart of a process 80 for operating a circuit. The process 80 includes receiving a high-speed clock, $f_{in}$, as an input to a programmable frequency divider (step 81); modulating the high-speed clock with a Sigma-Delta modulator which is connected to the programmable frequency divider to control an average frequency of an output of programmable frequency divider (step 82); controlling the Sigma-Delta modulator with a Frequency Control Word (FCW), F, and an integer divisor, I, each of the FCW and the integer divisor is connected to the programmable frequency divider (step 83); providing an output of the programmable frequency divider as a modulated reference clock, wherein the modulated reference clock is connected to the Sigma-Delta modulator as a sample clock (step 84); and receiving the modulated reference clock at an integer-N Phase Lock Loop (PLL) and outputting a clock output (step 85).

The modulated reference clock is equal to $$\frac{f_{in}}{I + F},$$

and wherein the clock output is equal to equal to $$f_{in} \frac{M}{I + F}.$$

The high-speed clock can be from an existing Phase Lock Loop (PLL) associated with the circuit. The circuit can provide a Numerically Controlled Oscillator (NCO) function based on selected values for the FCW, the integer divisor, and the integer-N PLLC, and wherein the circuit drives a Serializer/Deserializer (SerDes). The FCW defines a numerator value for the programmable frequency divider and a denominator value for the programmable frequency divider is set by one of i) rail voltages for an analog Sigma-Delta modulator and ii) a number of accumulator bits for a digital Sigma-Delta modulator. The circuit can be disposed in an Application Specific Integrated Circuit (ASIC) on a Printed Circuit Board (PCB). The high-speed clock can be from an existing PLL on the ASIC which receives an input reference clock from the PCB.

In another embodiment, a circuit includes a programmable frequency divider 14 which receives a high-speed clock 12, $f_{in}$, as an input; a Sigma-Delta modulator 16 which receives a Frequency Control Word (FCW) 18, F, and which is connected to the programmable frequency divider 14 to control an average frequency of an output of programmable frequency divider 14; an integer divisor 26, I, which is connected to the programmable frequency divider 14; an output of the programmable frequency divider which provides a modulated reference clock 20, wherein the modulated reference clock 20 is connected to the Sigma-Delta modulator 16 as a sample clock 24; and an integer-N Phase Lock Loop (PLL) 22 which receives the modulated reference clock 20 and outputs a clock output.

The modulated reference clock is equal to $$\frac{f_{in}}{I+F},$$

and wherein the clock output is equal to equal to $$f_{in}\frac{M}{I+F}.$$

The high-speed clock can be from an existing Phase Lock Loop (PLL) associated with the circuit. The existing Phase Lock Loop (PLL) can be for a Digital-Analog Converter (DAC) sampling clock. The circuit can provide a Numerically Controlled Oscillator (NCO) function based on selected values for the FCW, the integer divisor, and the integer-N PLLC, and wherein the circuit drives a Serializer/Deserializer (SerDes).

The FCW defines a numerator value for the programmable frequency divider, and a denominator value for the programmable frequency divider is set by one of i) rail voltages for an analog Sigma-Delta modulator and ii) a number of accumulator bits for a digital Sigma-Delta modulator. The circuit can be disposed in an Application Specific Integrated Circuit (ASIC) on a Printed Circuit Board (PCB). The high-speed clock can be from an existing PLL on the ASIC which receives an input reference clock from the PCB.

In a further embodiment, an apparatus includes a Printed Circuit Board (PCB) 32 with a reference clock 34; a circuit 30 including: a Phase Lock Loop (PLL) 36 which is served by the reference clock; a programmable frequency divider 14 which receives a high-speed clock 12, $f_{in}$, as an input, wherein the high-speed clock 12 is reused from the reference clock 34; a Sigma-Delta modulator 16 which receives a Frequency Control Word (FCW) 18, F, and which is connected to the programmable frequency divider 14 to control an average frequency of an output of programmable frequency divider 14; an integer divisor 26, I, which is connected to the programmable frequency divider 14; an output of the programmable frequency divider 14 which provides a modulated reference clock 20, wherein the modulated reference clock 20 is connected to the Sigma-Delta modulator 16 as a sample clock 24; and an integer-N Phase Lock Loop (PLL) 22 which receives the modulated reference clock 20 and outputs a clock output.

The modulated reference clock is equal to $$\frac{f_{in}}{I+F},$$

and wherein the clock output is equal to equal to $$f_{in}\frac{M}{I+F}.$$

The existing Phase Lock Loop (PLL) can be for a Digital-Analog Converter (DAC) sampling clock. The circuit can provide a Numerically Controlled Oscillator (NCO) function based on selected values for the FCW, the integer divisor, and the integer-N PLLC, and wherein the circuit drives a Serializer/Deserializer (SerDes). The FCW can define a numerator value for the programmable frequency divider and a denominator value for the programmable frequency divider is set by one of i) rail voltages for an analog Sigma-Delta modulator and ii) a number of accumulator bits for a digital Sigma-Delta modulator.

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A circuit comprising:
   a Digital-Analog Converter (DAC) Phase Lock Loop (PLL) which receives a reference clock and generates a high-speed clock, $f_{in}$, wherein the DAC PLL and the high-speed clock, $f_{in}$, are for an optical transmitter of a high-speed optical transceiver or modem; and
   a clock frequency modulator device configured to receive the high-speed clock, $f_{in}$, which is reused from the optical transmitter for a client side of the high-speed optical transceiver or modem, wherein the clock frequency modulator device includes
a programmable frequency divider which receives the high-speed clock, $f_{in}$, as an input from the DAC PLL and provides a modulated reference clock as an output;
a Sigma-Delta modulator which receives a Frequency Control Word (FCW) and which is connected to the programmable frequency divider to receive the modulated reference clock as a sample clock, the Sigma-Delta modulator configured to provide the FCW to the programmable frequency divider to control an average frequency of the modulated reference clock provided as the output of the programmable frequency divider, wherein the FCW is set based on tracking the client side, thereby reusing the high-speed clock, $f_{in}$, for both the transmitter and the client side of the high-speed optical transceiver or modem; and
an integer-N Phase Lock Loop (PLL) that operates at an integer value and which receives the modulated reference clock and outputs a clock output;
wherein the circuit achieves fractional-N frequency synthesis without the use of a fractional-N PLL.

2. The circuit of claim 1, wherein an average frequency of the modulated reference clock is equal to $$\frac{f_{in}}{I+FCW},$$

and wherein the frequency of the clock output is equal to $$f_{in}\frac{M}{I+FCW},$$

where M is a divisor ratio set by the programmable frequency divider, and where I is an integer divisor.

3. The circuit of claim 1, wherein an integer divisor (I) is provided to the programmable frequency divider with the FCW, wherein the programmable frequency divider and Sigma-Delta modulator are configured to perform a Numerically Controlled Oscillator (NCO) function based on selected values for the FCW, the integer divisor (I), and the integer-N PLL, and wherein the circuit drives a Serializer/Deserializer (SerDes).

4. The circuit of claim 1, wherein the FCW defines a numerator value for the programmable frequency divider, and wherein a denominator value for the programmable frequency divider is set by one of i) rail voltages for an analog Sigma-Delta modulator and ii) a number of accumulator bits for a digital Sigma-Delta modulator.

5. The circuit of claim 1, wherein the circuit is disposed in an Application Specific Integrated Circuit (ASIC) on a Printed Circuit Board (PCB).

6. The circuit of claim 5, wherein the DAC PLL is disposed on the ASIC which receives the reference clock from the PCB.

7. An apparatus comprising:
a Printed Circuit Board (PCB) with a reference clock;
a circuit including:
a Digital-Analog Converter (DAC) Phase Lock Loop (PLL) configured to receive the reference clock and provide a high-speed clock, $f_{in}$, wherein the DAC PLL and the high-speed clock, $f_{in}$, are for an optical transmitter of a high-speed optical transceiver or modem; and
a clock frequency modulator device configured to receive the high-speed clock, $f_{in}$, which is reused from the optical transmitter for a client side of the high-speed optical transceiver or modem, wherein the clock frequency modulator device includes
a programmable frequency divider which receives the high-speed clock, $f_{in}$, as an input from the DAC PLL and provides a modulated reference clock as an output;
a Sigma-Delta modulator which receives a Frequency Control Word (FCW) and which is connected to the programmable frequency divider to receive the modulated reference clock as a sample clock, the Sigma-Delta modulator configured to provide the FCW to the programmable frequency divider to control an average frequency of the modulated reference clock provided as the output of the programmable frequency divider, wherein the FCW is set based on tracking the client side, thereby reusing the high-speed clock, $f_{in}$, for both the transmitter and the client side of the high-speed optical transceiver or modem; and
an integer-N PLL that operates at an integer value and which receives the modulated reference clock and outputs a clock output;
wherein the circuit achieves fractional-N frequency synthesis without the use of a fractional-N PLL.

8. The apparatus of claim 7, wherein an average frequency of the modulated reference clock is equal to $$\frac{f_{in}}{I+FCW},$$

and wherein the frequency of the clock output is equal to $$f_{in}\frac{M}{I+FCW},$$

where M is a divisor ratio set by the programmable frequency divider, and where I is an integer divisor.

9. The apparatus of claim 7, wherein an integer divisor (I) is provided to the programmable frequency divider with the FCW, wherein the programmable frequency divider and Sigma-Delta modulator are configured to perform a Numerically Controlled Oscillator (NCO) function based on selected values for the FCW, the integer divisor (I), and the integer-N PLL, and wherein the circuit drives a Serializer/Deserializer (SerDes).

10. The apparatus of claim 7, wherein the FCW defines a numerator value for the programmable frequency divider, and wherein a denominator value for the programmable frequency divider is set by one of i) rail voltages for an analog Sigma-Delta modulator and ii) a number of accumulator bits for a digital Sigma-Delta modulator.

11. A method of operating a circuit comprising:
generating a high-speed clock, $f_{in}$, from a Digital-Analog Converter (DAC) Phase Lock Loop (PLL), wherein the DAC PLL and the high-speed clock, $f_{in}$, are in for an optical transmitter of a high-speed optical transceiver or modem;

receiving the high-speed clock, $f_{in}$, as an input to a programmable frequency divider, wherein the high-speed clock, $f_{in}$, is reused from the optical transmitter for a client side of the high-speed optical transceiver or modem by a clock frequency modulator device that performs steps of modulating the high-speed clock, $f_{in}$, with a Sigma-Delta modulator and providing a Frequency Control Word (FCW) to the programmable frequency divider to control an average frequency of an output of the programmable frequency divider;

controlling the Sigma-Delta modulator with the FCW and an integer divisor, wherein each of the FCW and the integer divisor is connected to the programmable frequency divider, wherein the FCW is set based on tracking the client side, thereby reusing the high-speed clock, $f_{in}$, for both the transmitter and the client side of the high-speed optical transceiver or modem;

providing an output of the programmable frequency divider as a modulated reference clock, wherein the modulated reference clock is connected to the Sigma-Delta modulator as a sample clock, and wherein the modulated reference clock achieves fractional-N frequency synthesis without the use of a fractional-N PLL; and receiving the modulated reference clock at an integer-N PLL that operates at an integer value and outputting a clock output.

12. The method of claim 11, wherein an average frequency of the modulated reference clock is equal to $$\frac{f_{in}}{I + FCW},$$

and wherein the frequency of the clock output is equal to $$f_{in} \frac{M}{I + FCW},$$

where M is a divisor ratio set by the programmable frequency divider, and where I is an integer divisor.

13. The method of claim 11, further comprising:
utilizing the programmable frequency divider and Sigma-Delta modulator to perform a Numerically Controlled Oscillator (NCO) function based on selected values for the FCW, the integer divisor, and the integer-N PLLC.

14. The method of claim 11, wherein the FCW defines a numerator value for the programmable frequency divider, and wherein a denominator value for the programmable frequency divider is set by one of i) rail voltages for an analog Sigma-Delta modulator and ii) a number of accumulator bits for a digital Sigma-Delta modulator.

15. The method of claim 11, wherein the circuit is disposed in an Application Specific Integrated Circuit (ASIC) on a Printed Circuit Board (PCB).

16. The method of claim 15, wherein the first PLL is disposed on the ASIC which receives an input reference clock from the PCB.

* * * * *